(12) United States Patent
Guo et al.

(10) Patent No.: US 9,901,892 B2
(45) Date of Patent: Feb. 27, 2018

(54) ANTICOKING CATALYST COATINGS WITH ALUMINA BARRIER LAYER

(71) Applicant: GENERAL ELECTRIC COMPANY, Schenectady, NY (US)

(72) Inventors: Minghu Guo, Shanghai (CN); Chuan Lin, Shanghai (CN); Yanfei Gu, Shanghai (CN); Wen-Qing Peng, Shanghai (CN); Lawrence Bernard Kool, Clifton Park, NY (US); Hong Zhou, Shanghai (CN); Zhaohui Yang, Shanghai (CN)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 190 days.

(21) Appl. No.: 14/651,240

(22) PCT Filed: Nov. 20, 2013

(86) PCT No.: PCT/US2013/070863
§ 371 (c)(1),
(2) Date: Jun. 11, 2015

(87) PCT Pub. No.: WO2014/092944
PCT Pub. Date: Jun. 9, 2014

(65) Prior Publication Data
US 2015/0306558 A1    Oct. 29, 2015

(30) Foreign Application Priority Data
Dec. 13, 2012    (CN) .......................... 2012 1 0541299

(51) Int. Cl.
*B01J 8/06*    (2006.01)
*B01J 21/04*    (2006.01)
(Continued)

(52) U.S. Cl.
CPC .............. *B01J 8/06* (2013.01); *B01J 23/002* (2013.01); *B01J 23/02* (2013.01); *B01J 23/10* (2013.01);
(Continued)

(58) Field of Classification Search
CPC ... B01J 8/06; B01J 23/002; B01J 23/02; B01J 23/10; B01J 23/26; B01J 23/34;
(Continued)

(56) References Cited

U.S. PATENT DOCUMENTS 3,227,659 A * 1/1966 Brandenburg ..... B01D 53/8671
422/177
3,228,892 A * 1/1966 Cole .................... B01J 37/0226
502/300
(Continued)

FOREIGN PATENT DOCUMENTS

CN        102557855 A    7/2012
WO        9316210 A1     8/1993

OTHER PUBLICATIONS

PCT Search Report and Written Opinion issued in connection with corresponding PCT Application No. PCT/US2013/070863 dated Apr. 2, 2014.
(Continued)

*Primary Examiner* — Cam N. Nguyen
(74) *Attorney, Agent, or Firm* — Wegman, Hessler & Vanderburg

(57) ABSTRACT

An article including a metal substrate, an anti-coking catalyst layer and an alumina barrier layer disposed between the metal substrate and the anti-coking catalyst layer is provided. A process for making the article is also provided.

12 Claims, 1 Drawing Sheet

(51) Int. Cl.
| | |
|---|---|
| B01J 21/06 | (2006.01) |
| B01J 23/00 | (2006.01) |
| B01J 23/02 | (2006.01) |
| B01J 23/10 | (2006.01) |
| B01J 23/26 | (2006.01) |
| B01J 23/34 | (2006.01) |
| B01J 23/745 | (2006.01) |
| B01J 23/755 | (2006.01) |
| B01J 23/76 | (2006.01) |
| B01J 23/78 | (2006.01) |
| B01J 35/00 | (2006.01) |
| B01J 37/02 | (2006.01) |
| C10G 9/16 | (2006.01) |
| C23C 8/10 | (2006.01) |
| C23C 8/80 | (2006.01) |
| C23C 10/30 | (2006.01) |
| C23C 24/06 | (2006.01) |
| C23C 24/10 | (2006.01) |
| C23C 28/04 | (2006.01) |
| C10G 75/00 | (2006.01) |
| B05D 1/02 | (2006.01) |
| C23C 2/02 | (2006.01) |
| C23C 16/02 | (2006.01) |
| C23C 16/44 | (2006.01) |
| C23C 18/16 | (2006.01) |
| C23C 18/18 | (2006.01) |
| C23C 4/134 | (2016.01) |
| B01J 37/34 | (2006.01) |
| B01J 37/00 | (2006.01) |
| B01J 37/08 | (2006.01) |
| B01J 23/889 | (2006.01) |
| B01J 23/83 | (2006.01) |
| B01J 23/86 | (2006.01) |

(52) U.S. Cl.
CPC ............... *B01J 23/26* (2013.01); *B01J 23/34* (2013.01); *B01J 35/002* (2013.01); *B01J 37/0217* (2013.01); *B01J 37/0225* (2013.01); *B01J 37/0226* (2013.01); *B01J 37/0238* (2013.01); *B05D 1/02* (2013.01); *C10G 9/16* (2013.01); *C10G 75/00* (2013.01); *C23C 2/02* (2013.01); *C23C 4/134* (2016.01); *C23C 8/10* (2013.01); *C23C 8/80* (2013.01); *C23C 10/30* (2013.01); *C23C 16/0209* (2013.01); *C23C 16/44* (2013.01); *C23C 18/1633* (2013.01); *C23C 18/18* (2013.01); *C23C 24/06* (2013.01); *C23C 24/106* (2013.01); *C23C 28/04* (2013.01); *B01J 23/78* (2013.01); *B01J 23/83* (2013.01); *B01J 23/86* (2013.01); *B01J 23/8892* (2013.01); *B01J 37/0036* (2013.01); *B01J 37/0219* (2013.01); *B01J 37/08* (2013.01); *B01J 37/343* (2013.01); *B01J 37/349* (2013.01); *B01J 2208/06* (2013.01); *B01J 2523/00* (2013.01); *C10G 2300/708* (2013.01)

(58) Field of Classification Search
CPC ........ B01J 35/002; B01J 21/04; B01J 21/066; B01J 23/745; B01J 23/755; B01J 23/76; B01J 23/78; B01J 23/83
See application file for complete search history.

(56) References Cited

U.S. PATENT DOCUMENTS

| | | | | |
|---|---|---|---|---|
| 3,231,520 | A * | 1/1966 | Leak | B01D 53/944 208/120.15 |
| 3,362,783 | A * | 1/1968 | Leak | B01D 53/944 422/180 |
| 4,297,150 | A * | 10/1981 | Foster | B01J 12/00 148/276 |
| 5,833,838 | A | 11/1998 | Heyse et al. | |
| 6,015,285 | A * | 1/2000 | McCarty | B01J 19/2485 431/7 |
| 6,127,048 | A * | 10/2000 | Beele | C23C 14/024 416/241 B |
| 6,488,907 | B1 | 12/2002 | Barnes et al. | |
| 7,270,852 | B2 | 9/2007 | Kool et al. | |
| 7,332,024 | B2 | 2/2008 | Kool | |
| 7,449,241 | B2 | 11/2008 | Gigliotti et al. | |
| 7,575,815 | B2 | 8/2009 | Henager et al. | |
| 7,829,142 | B2 | 11/2010 | Kool et al. | |
| 7,832,845 | B2 | 11/2010 | Mita | |
| 8,080,436 | B2 | 12/2011 | Sugiyama | |
| 8,153,469 | B2 | 4/2012 | Aksu et al. | |
| 8,158,550 | B2 * | 4/2012 | Cimino | B01J 23/002 502/302 |
| 8,230,797 | B2 | 7/2012 | Chan et al. | |
| 8,366,805 | B2 * | 2/2013 | Ma | B01D 53/228 427/331 |
| 8,545,780 | B1 * | 10/2013 | Chen | B01D 53/945 423/213.2 |
| 8,835,346 | B2 * | 9/2014 | Gramiccioni | B01J 37/0242 423/213.2 |
| 9,517,448 | B2 * | 12/2016 | Kearl | B01D 53/9422 |
| 2002/0028344 | A1 | 3/2002 | Beele | |
| 2005/0066663 | A1 * | 3/2005 | Alvin | F23C 13/00 60/723 |
| 2009/0148357 | A1 | 6/2009 | Kaneeda et al. | |
| 2010/0068556 | A1 | 3/2010 | Lemmon et al. | |
| 2010/0132546 | A1 * | 6/2010 | Ma | B01D 53/228 95/56 |
| 2011/0017997 | A1 | 1/2011 | Kamath | |
| 2013/0267750 | A1 | 10/2013 | Gu et al. | |
| 2014/0031197 | A1 * | 1/2014 | Gramiccioni | B01J 37/0242 502/217 |

OTHER PUBLICATIONS

Unofficial English Translation of Chinese Office Action issued in connection with corresponding CN Application No. 201210541299.2 dated May 20, 2015.

* cited by examiner

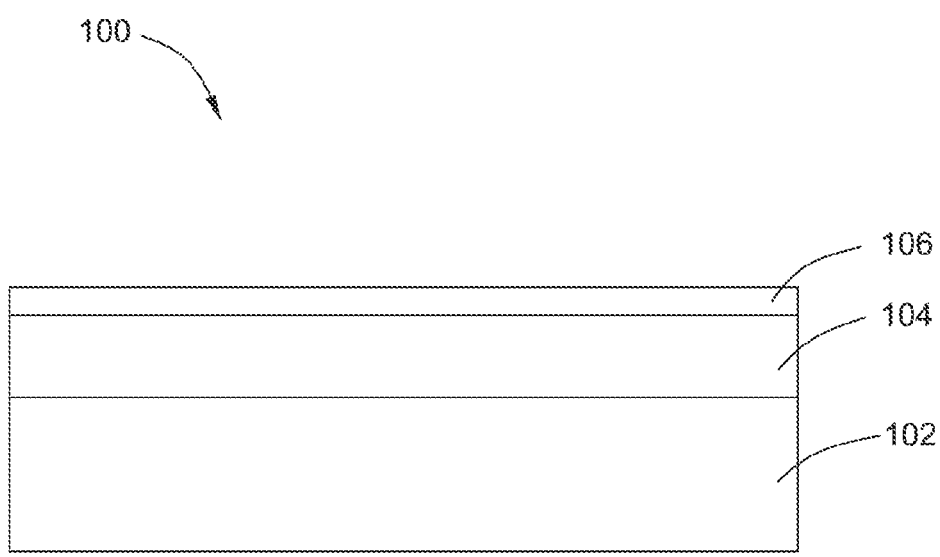

US 9,901,892 B2

ANTICOKING CATALYST COATINGS WITH ALUMINA BARRIER LAYER

BACKGROUND

Various anti-coking catalysts have been developed to prevent coking and plugging on articles that are used in thermal cracking of heavy petroleum oils. For example, it has been discovered that perovskite catalysts work well to remove and/or reduce coking on furnace tubes in thermal cracking, such as ethylene cracking processes. Usually, the anti-coking catalyst is coated onto an interior surface of the article, which encounters the heavy petroleum oils being processed at very high temperatures. As to articles used in thermal cracking of heavy petroleum oils, even those coated with anti-coking catalysts, regular (extended or repeated) decoking is usually required to remove coke deposits in the walls of the articles. A typical decoking process involves oxidizing the coke deposits under oxidizing conditions to produce carbon dioxide and by-products. However, some of the anti-coking catalysts, such as the perovskite catalysts, may react with specific elements migrating from the substrate of the article upon application of heat during the decoking process (under oxidizing conditions), and thus be lowered in catalytic activity. For instance, perovskite catalysts coated on a furnace tube made from a chromium containing material may react with chromium migrating from the tube during a decoking process to form materials without catalytic activity. Therefore it is desired to provide an article for use in a thermal cracking process having an anti-coking catalyst coating that is not deactivated by elements migrating from the substrate on which the catalyst is coated.

BRIEF DESCRIPTION

In one aspect, the present disclosure relates to an article which includes a metal substrate, an anti-coking catalyst layer, and an alumina barrier layer disposed between the metal substrate and the anti-coking catalyst layer.

In another aspect, the present disclosure also relates to a process which includes: aluminizing a metal substrate, heat treating the aluminized metal substrate to form an alumina barrier layer over the metal substrate, and applying an anti-coking catalyst layer to the alumina barrier layer.

BRIEF DESCRIPTION OF THE DRAWINGS

The above and other aspects, features, and advantages of the present disclosure will become more apparent in light of the subsequent detailed description when taken in conjunction with the accompanying drawings in which:

FIG. 1 is a schematic view of an article with an alumina barrier layer disposed between article metal substrate and a catalyst coating layer.

DETAILED DESCRIPTION

Approximating language, as used herein throughout the specification and claims, may be applied to modify any quantitative representation that could permissibly vary without resulting in a change in the basic function to which it is related. Accordingly, a value modified by a term or terms, such as "about," is not to be limited to the precise value specified. In certain embodiments, the term "about" means plus or minus ten percent (10%) of a value. For example, "about 100" would refer to any number between 90 and 110. Additionally, when using an expression of "about a first value-a second value," the about is intended to modify both values. In some instances, the approximating language may correspond to the precision of an instrument for measuring the value or values.

Any numerical values recited herein include all values from the lower value to the upper value in increments of one unit provided that there is a separation of at least 2 units between any lower value and any higher value. As an example, if it is stated that the dosage of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

Unless defined otherwise, technical and scientific terms used herein have the same meaning as is commonly understood by one of skill in the art to which this invention belongs. The terms "first," "second," and the like, as used herein do not denote any order, quantity, or importance, but rather are used to distinguish one element from another. Also, the terms "a" and "an" do not denote a limitation of quantity, but rather denote the presence of at least one of the referenced items.

Articles for processing feedstock at a high temperature, for example, articles for cracking hydrocarbon having an inner surface accessible to the hydrocarbon, typically are provided with an anti-coking catalyst coating to prevent coking and plugging. In embodiments of the present invention, an alumina barrier layer is disposed between a metal substrate and the anti-coking catalyst coating. The alumina barrier layer is capable of preventing one or more elements which deactivate the catalyst from diffusing from the metal substrate into the catalyst coating.

As used herein, the term "reactor" refers to but is not limited to at least one of a furnace tube, a tube fitting, a reaction vessel, and a radiant tube or coil, used in petrochemical processes. The reactor may be a pyrolysis furnace comprising a firebox through which runs an array of tubing. The array of tubing and corresponding fittings may total several hundred meters in length. The array of tubing may comprise straight or serpentine tubes.

An article with an alumina barrier layer disposed between the substrate of the article and the anti-coking catalyst coating may be used in reactors for cracking hydrocarbon, in which the build-up of coke deposits are undesirable. The reactor may be any reactor in which hydrocarbon is cracked. In some embodiments, the reactor comprises at least one of a furnace tube, a tube fitting, a reaction vessel, and a radiant tube or coil. In some embodiments, the reactor comprises a firebox having a furnace tube placed inside and being heated to a temperature from about 500° C. to about 1000° C.

As used herein the term "cracking hydrocarbon" refers to but is not limited to processes in which hydrocarbons such as ethane, propane, butane and naphtha are cracked in reactors, in the presence of from about 30 to 70 weight percentage of steam, at temperatures of from about 700° C. to about 870° C. in order to produce light olefins such as ethylene and propylene. Sometimes, hydrocarbons such as bottoms from atmospheric and vacuum distillation of crude oil are cracked in reactors at a temperature in a range from about 480° C. to about 600° C. in the presence of about 1 wt % to about 2 wt % steam.

As used herein the term "coke" refers to but is not limited to carbonaceous solid or liquid or particulates or macromolecules forming the carbonaceous solid or liquid, which are derived from coal, petroleum, wood, hydrocarbons and other materials containing carbon and which include, for example, carbon black, tar, and pyrolytic coke existing in hydrocarbon cracking furnace.

In one aspect, an article with an alumina barrier layer is provided. As shown in FIG. 1, an article 100 includes a metal substrate 102, an anti-coking catalyst layer 104 and an alumina barrier layer 106 formed between the metal substrate 102 and the catalyst layer 104. An aluminide layer may be disposed between the metal substrate 102 and the alumina barrier layer 106. The metal substrate 102 may be in various shapes. In one embodiment, the metal substrate is a tube that provides an inner surface for encountering an oxidative feedstock being processed at a high temperature. The alumina barrier layer is formed over the inner surface of the tube and the anti-coking catalyst layer is formed on the alumina barrier layer. The metal substrate 102 may be made from metal materials including but not limited to iron base alloys, nickel base alloys and cobalt base alloys. As to an article for use in a thermal cracking process, the substrate of the article may include at least one of chromium, nickel and iron, and in particular it be made from a metal containing chromium, nickel and iron. Non-limiting examples of suitable metal materials are 25Cr20Ni steel, 35Cr45Ni steel, and nickel base super alloys. In certain embodiments, the substrate contains less than 3 wt %, or particularly less than 0.05 wt % aluminum.

The anti-coking catalyst in the layer 104 may be perovskite. As used herein, the term "perovskite" refers to a perovskite material of formula $A_aB_bC_cD_dO_{3-\delta}$, wherein $0<a<1.2$, $0\leq b\leq 1.2$, $0.9<a+b\leq 1.2$, $0<c<1.2$, $0\leq d\leq 1.2$, $0.9<c+d1.2$, $-0.5<\delta<0.5$;

A is selected from calcium (Ca), strontium (Sr), barium (Ba), and any combination thereof;

B is selected from lithium (Li), sodium (Na), potassium (K), rubidium (Rb), and any combination thereof;

C is selected from cerium (Ce), zirconium (Zr), antimony (Sb), praseodymium (Pr), titanium (Ti), chromium (Cr), manganese (Mn), ferrum (Fe), cobalt (Co), nickel (Ni), gallium (Ga), tin (Sn), terbium (Tb) and any combination thereof; and D is selected from lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), scandium (Sc), titanium (Ti), vanadium (V), chromium (Cr), manganese (Mn), ferrum (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), hafnium (Hf), tantalum (Ta), tungsten (W), rhenium (Re), osmium (Os), iridium (Ir), platinum (Pt), gold (Au), gallium (Ga), indium (In), tin (Sn), antimony (Sb) and any combination thereof.

In some specific embodiments, the anti-coking catalyst is a perovskite selected from the group consisting of doped $LaCrO_3$, doped $LaMnO_3$, $BaCeO_3$, $BaZrO_3$, $BaCe_xZr_{(1-x)}O_3$, $BaCe_xY_{(1-x)}O_3$ and any combination thereof, where $0\leq x\leq 1$. In particular, the catalyst may be $BaCe_{0.7}Zr_{0.3}O_3$.

In some embodiments, the anti-coking catalyst in the layer 104 is carnegieite. As used herein, the term "carnegieite" refers to but is not limited to the material having a $Na_2O$ stabilized (or intercalated or rich) high-carnegieite like crystal structure, i.e., a structure with certain amount of $Na_2O$ intercalated into a cubic host lattice with group symmetry $P2_{13}$ or $F\bar{4}3m$.

The alumina barrier layer 106 is a dense α-alumina barrier layer capable of preventing undesired elements such as chromium from diffusing from the substrate 102 to the catalyst layer 104. In certain embodiments, the alumina barrier layer 106 has a thickness ranging from about 0.01 micrometer into about 10 micrometers, or preferably from about 1 micrometer to about 5 micrometers.

By aluminizing and then heat treating the metal substrate, an alumina barrier layer is formed over the metal substrate. An anti-coking catalyst such as perovskite is applied to the alumina barrier layer to form a catalyst coating. Besides the alumina barrier layer, there may be additional layers between the metal substrate and the catalyst coating. For example, in some embodiments, an aluminide layer formed during aluminizing is still present after the alumina barrier layer is formed, and thus there is an aluminide layer between the metal substrate and the alumina barrier layer. The metal substrate may be aluminized by chemical vapor deposition (CVD), slurry coating, plating, hot dipping or spray.

Where the metal substrate is aluminized by a CVD process, the metal substrate is placed into a vacuum furnace and baked at a pressure of about 0.1-5.0 Pa and a temperature of about 800-1200° C. or preferably about 800-1100° C. for about 2-24 hours. Suitable precursors for aluminizing include gaseous $AlCl_3$ or materials that can produce gaseous $AlCl_3$ under the condition for aluminizing Gaseous aluminizing precursor may be fed into the vacuum furnace where the metal substrate is aluminized Solid aluminizing precursor may be placed into the vacuum furnace together with the metal substrate. In a specific embodiment, gaseous $AlCl_3$ is fed into the vacuum furnace using hydrogen as the carrier gas. In a specific embodiment, solid powder including aluminum, iron and $NH_4Cl$ is used as the aluminizing precursor and placed into the vacuum furnace together with the metal substrate. The aluminum and $NH_4Cl$ react with each other to produce $AlCl_3$ for aluminizing under the condition of the vacuum furnace. The iron in the solid powder functions as a buffering agent for slowing down the reaction between the aluminum and $NH_4Cl$. Hydrogen may be filled into the vacuum furnace for assisting the aluminizing. The baking time depends on the required thickness of the barrier coating. Longer time results in a thicker coating.

Where the metal substrate is aluminized by a slurry coating technique, a slurry including aluminum is applied to the metal substrate and the coated substrate is heat treated. Aluminum in the slurry diffuses into the surface region of the metal substrate to form a metal aluminide coating on a surface of the metal substrate. In some specific embodiments, the metal substrate is aluminized by slurry aluminizing processes described in commonly assigned U.S. Pat. No. 7,569,283, U.S. Pat. No. 7,332,024, and U.S. Pat. No. 7,829,142 which are herein incorporated by reference in their entirety.

Various slurry compositions may be used. Besides those described in the aforementioned U.S. Pat. No. 7,569,283, U.S. Pat. No. 7,332,024 and U.S. Pat. No. 7,829,142, the slurry may have compositions such as those described in U.S. Pat. No. 7,270,852, U.S. Pat. No. 7,449,241 and U.S. Pat. No. 7,896,962, which are herein incorporated by reference in their entirety. The slurry may be applied to the metal substrate by sponging, painting, centrifuging, spraying, filling and draining or dipping.

In a specific embodiment, the slurry composition includes an aluminum based powder, colloidal silica and glycerol. The aluminum based powder may be any powder which contains at least about 75% by weight aluminum based on total elements present, for example, aluminum powder, aluminum-silicon alloy powder, and combinations thereof. The metal substrate applied with a layer of the slurry is cured at about 50-250° C. for several hours to dry the slurry layer, then baked by three stages of heating and then subjected to a two stage diffusion heat treatment. During the diffusion heat treatment, aluminum in the slurry diffuses into the metal substrate to form a metal aluminide (such as FeAl, CrAl, and $Ni_3Al$) coating on the surface of the metal substrate.

The aluminized substrate may be heat treated at a temperature ranging from about 800° C. to about 1100° C., or preferably from about 900° C. to about 1000° C. in an oxidative atmosphere of about 0.05-0.5 Pa. During the heat treatment, the metal aluminide is oxidized and an alumina barrier layer is formed over the metal substrate. The metal aluminide may remain between the metal substrate and the alumina barrier layer.

The anti-coking catalyst may be applied to the alumina barrier layer by plasma spraying, chemical vapour deposition or slurry coating. In certain embodiments, a perovskite catalyst is applied to the alumina barrier layer via slurry coating. A slurry coating process for applying the perovskite catalyst to the alumina barrier layer may include: preparing a slurry including a perovskite catalyst; applying the metal substrate with a layer of the slurry; and then sintering the metal substrate with the slurry layer. The slurry may be prepared from perovskite catalyst powder, and at least one of an organic binder, a wetting agent and a solvent. The slurry layer may be dried before sintering, at a temperature relatively lower than that for sintering. In a specific embodiment, the metal substrate with the slurry layer is dried at about 100° C. and then sintered at a temperature of about 900-1100° C. for about 2-5 hours in argon atmosphere.

In some specific embodiments, the slurry composition and coating process described in a commonly assigned U.S. patent application Ser. No. 11/63,324, which is herein incorporated by reference in its entirety, is used. A slurry including a perovskite catalyst and an inorganic material which includes at least one of cerium oxide, zinc oxide, tin oxide, zirconium oxide, boehmite and silicon dioxide, is provided and applied to a surface of an article (reactor). By sintering the slurry at about 1000° C., a perovskite catalyst coating is formed over the surface of the article.

Example 1

In this example, nine 25Cr20Ni steel coupons (samples) were used as the substrates. The composition by weight of the 25Cr20Ni steel coupons is listed in the table below.

| C | Si | Mn | Cr | Ni | Fe |
| --- | --- | --- | --- | --- | --- |
| 0.13 wt % | 0.48 wt % | 1.35 wt % | 26.25 wt % | 21 wt % | balance |

The coupons were polished by grit sandpaper, grit blasted with $Al_2O_3$, and then ultrasonic cleaned in alcohol. Then the clean coupons were aluminized through a chemical vapor deposition (CVD) aluminizing process. The parameter used for the CVD aluminizing process was:

Pressure: 0.8 Pa
Temperature: 1050° C.
Time: 6 hours

Solid power with a composition listed in the table below was used as the aluminizing precursor.

| Al | $NH_4Cl$ | Fe |
| --- | --- | --- |
| 50 wt % | 3 wt % | balance |

By the CVD aluminizing process, an aluminide coating was formed on the surface of each coupon. The nine aluminized coupons were cleaned. Then eight of the coupons (samples 1-8) were heat-treated for oxidation to form alumina layers thereon, and the remaining coupon (sample 9) was kept for direct catalyst coating. During the heat treatment process, the eight aluminized coupons were placed into a vacuum furnace, which was heated to a temperature ranging from about 900° C. to about 1000° C. within about 3 hours and then backfilled with air to a pressure ranging from about 0.05 Pa to about 0.5 Pa, and kept for a period ranging from about 20 hours to 30 hours. For comparative purposes, the eight coupons were divided into four groups which were heat treated with different parameters, respectively. Detailed heat treatment parameters for the coupons are shown in the following table.

| Sample | Temperature (° C.) | Pressure (Pa) | Time (hours) |
| --- | --- | --- | --- |
| 1 | 1000 | 0.05 | 20 |
| 2 | 1000 | 0.05 | 20 |
| 3 | 900 | 0.05 | 30 |
| 4 | 900 | 0.05 | 30 |
| 5 | 900 | 0.5 | 20 |
| 6 | 900 | 0.5 | 20 |
| 7 | 1000 | 0.5 | 30 |
| 8 | 1000 | 0.5 | 30 |

After the heat treatment, an alumina layer with a thickness of about 1-5 micrometers was formed over each of the eight coupons. By comparing thicknesses of the alumina layers formed over the samples 1-8 respectively, it was found that the layer thickness increases with the increase of the heat treatment temperature and time, and increases with the decrease of the heat treatment pressure.

Samples 1-8 (aluminized and oxidized), sample 9 (aluminized but not oxidized), and a naked 25Cr20Ni steel sample (sample 10, neither aluminized nor oxidized) were applied with an anti-coking catalyst coating, through a slurry coating process including following steps:

(1) Catalyst Powder ($BaCe_{0.7}Zr_{0.3}O_3$) Preparation

The catalyst powder ($BaCe_{0.7}Zr_{0.3}O_3$) was prepared by a solid-state reaction method. Stoichiometric amounts of high-purity barium carbonate, zirconium oxide, and cerium oxide powders (all from sinopharm chemical reagent Co., Ltd. (SCRC), Shanghai, China) were mixed in ethanol and ball-milled for 12 hours. The resultant mixtures were then dried and calcined at 1450° C. in air for 6 hours to form $BaCe_{0.7}Zr_{0.3}O_3$ powder. The powder was mixed with alcohol and then ball milled for 12 hours again. After the alcohol was dried, fine catalyst powder was prepared (d50=1.5 um).

(2) Slurry Preparation 31.37 g $BaCe_{0.7}Zr_{0.3}O_3$ powder prepared by the process described above was added into a plastic jar. 46.72 g $CeO_2$ sol (20 wt % in $H_2O$, Alfa Aesar #12730) was added into the plastic jar and used as inorganic binder to enhance $BaCe_{0.7}Zr_{0.3}O_3$ coating strength. 4.41 g glycerol was added to enhance the slurry wetting ability. 12.63 g PVA (10 wt % water solution) was added to get good green coating strength. 10 ul Triton X100 was added into the mixture to be used as de-foaming agent. The recipe is listed in the table below.

| | |
|---|---|
| $BaCe_{0.7}Zr_{0.3}O_3$ | 31.37 g |
| $CeO_2$ sol | 46.72 g |
| glycerol | 4.41 g |
| PVA | 12.63 g |
| Triton X100 | 10 ul |

The plastic jar was mounted on a Speed Mixer machine. After mixing for 3 minutes with the rotation speed of 2000 RPM, uniform slurry was prepared.

(3) Slurry Coating

Each of the samples was dipped into the slurry to make it coated with a layer of the slurry. Then the layer of slurry was dried. The sample with the dried slurry layer was put into a furnace for sintering at 1000° C. for 3 hours in Argon atmosphere. Then the samples were cooled with a cooling rate of about 1° C./min-6° C./min. Each of the samples was coated with a layer of $BaCe_{0.7}Zr_{0.3}O_3$. It was found that the catalyst coatings on the samples 1-8 showed much better adhesion with the substrate compared with the sample 9. Parts of the catalyst coating on the sample 9 peel off The sample 10 ($BaCe_{0.7}Zr_{0.3}O_3$ coated on the naked 25Cr20Ni steel substrate) was subjected to an oxidizing environment of air at 900° C. to simulate an accelerated de-coking process. It was found that after 8 hours of oxidation in the air, the $BaCe_{0.7}Zr_{0.3}O_3$ catalyst coating turned to yellow (the color of barium chromate). Then the sample was taken out to do X-ray diffraction (XRD) microstructure analysis. The XRD analysis showed that the main component in the catalyst coating is barium chromate. $BaCe_{0.7}Zr_{0.3}O_3$ had reacted with chromium to form barium chromate. After the XRD analysis, the sample 10 was subjected a simulated cracking test. During the simulated cracking test, it was found that the catalyst coating on the sample 10 almost lost the catalyst effect.

The samples 1-8 were subjected to a simulated de-coking process at 900° C. in air for a 200-hour lifetime test, during which the samples were taken out every 50 hours to do XRD microstructure analysis. The XRD analysis showed that catalyst on samples 1-8 lasts 200 hours without degradation. Moreover, it was found that, after the 200-hour lifetime test, the catalyst layers on samples 1-8 still showed good adhesion with the substrate. After the 200-hour lifetime test, the samples 1-8 were subjected a simulated cracking test, and the catalyst on these samples showed good anti-coking effect during the simulated cracking test.

Example 2

In this example, samples were prepared by the procedure of example 1 but using 35Cr45Ni steel coupons as the substrates. The composition by weight of the 35Cr45Ni steel coupons is listed in the table below.

| Ni | Cr | Si | C | Nb | Fe |
|---|---|---|---|---|---|
| 45 wt % | 35 wt % | 2.5 wt % | 0.45 wt % | 1.5 wt % | Balance |

Via a procedure the same with that of example 1, each of the samples was coated with a layer of $BaCe_{0.7}Zr_{0.3}O_3$.

Similarly, the resulting samples were subjected to a simulated de-coking process at 900° C. in air for a 200-hour lifetime test, during which the samples were taken out every 50 hours to do XRD microstructure analysis. The XRD analysis showed that catalyst on these tested samples lasts 200 hours without degradation. The catalyst layer on the samples still showed good adhesion with the substrate after the 200-hour lifetime test. After the 200-hour lifetime test, the samples were subjected a simulated cracking test, and the catalyst on these samples showed good anti-coking effect during the simulated cracking test.

Example 3

In this example, 25Cr20Ni steel coupons with a composition the same with that of example 1 were used as the substrates. Samples were prepared by a procedure similar to that of example 1 except the aluminizing process. The coupons in this example were aluminized by a process different from that of example 1.

During the aluminizing process of this example, the coupons were grit blasted with $Al_2O_3$ and then thermal degreased in an oven at about 240° C. for about 4 hours. Then a layer of slurry including aluminum was applied to the coupons. The composition of the slurry was as follows: 8 weight % of glycerine, 32 weight % of LP-30 colloidal silica, 45 weight % of aluminum powder (with a particle size of about 10 microns), and 15 weight % of aluminum-silicon alloy powder. The slurry was applied to the coupons with inlet air pressure at about 40 Psi to form a layer with a green thickness ranging from about 43 to 89 micrometers on each of the coupons. The coupons applied with the slurry were cured in an oven, which was heated to about 80° C. for about 1 hour, then heated up to about 120° C. for about 0.5 hour and then further heated up to about 220° C. for about 1 hour. Then the coupons were put into a vacuum furnace, heated to about 649° C. and maintained for about 15 minutes while the furnace was backfilled with argon to a pressure of about 0.5 Torr (626.5 Pa), and then further heated up to about 871° C. and maintained for about 2 hours. Thus the aluminum in the slurry diffused into the coupons to form an aluminide coating on the surface of each coupon. Afterwards, the coupons were cooled down in the furnace and taken out for burnishing off residues.

Then the aluminized coupons were heat treated to form alumina layers thereon and then coated with $BaCe_{0.7}Zr_{0.3}O_3$ layers on the alumina layers by a procedure the same with that of example 1.

Similarly, the resulting samples were subjected to a simulated de-coking process at 900° C. in air for a 200-hour lifetime test, during which the samples were taken out every 50 hours to do XRD microstructure analysis. The XRD analysis showed that catalyst on these tested samples lasts 200 hours without degradation. The catalyst layer on the samples still showed good adhesion with the substrate after the 200-hour lifetime test. After the 200-hour lifetime test, the samples were subjected a simulated cracking test, and the catalyst on these samples showed good anti-coking effect during the simulated cracking test.

The invention may be embodied in other specific forms without departing from the spirit or essential characteristics thereof. The foregoing embodiments are therefore to be considered in all respects as illustrative rather than limiting on the invention described herein. The scope of embodiments of the invention is thus indicated by the appended claims rather than by the foregoing description, and all changes that come within the meaning and range of equivalency of the claims are therefore intended to be embraced therein.

The invention claimed is:

1. An article, comprising:
   a metal substrate;
   an anti-coking catalyst layer; and
   an alumina barrier layer disposed between the metal substrate and the anti-coking catalyst layer,
      wherein said alumina barrier layer comprises α-alumina.

2. The article of claim 1, wherein the metal substrate is a tube having an inner surface, and the alumina barrier layer is disposed over the inner surface of the tube and the anti-coking catalyst layer is disposed on the alumina layer.

3. The article of claim 1, wherein the metal substrate comprises at least one of chromium, nickel and iron.

4. The article of claim 1, wherein the metal substrate contains less than 3 wt % aluminum.

5. The article of claim 1, wherein the metal substrate contains less than 0.05 wt % aluminum.

6. The article of claim 1, wherein the anti-coking catalyst comprises perovskite.

7. The article of claim 6, wherein the perovskite is selected from the group consisting of doped $LaCrO_3$, doped $LaMnO_3$, $BaCeO_3$, $BaZrO_3$, $BaCe_xZr_{(1-x)}O_3$, $BaCe_xY_{(1-x)}O_3$ and combinations thereof, wherein $0 \leq x \leq 1$.

8. The article of claim 7, wherein the perovskite is $BaCe_xZr_{(1-x)}O_3$, wherein $0 \leq x \leq 1$.

9. The article of claim 7, wherein the perovskite is $BaCe_{0.7}Zr_{0.3}O_3$.

10. An article, comprising:
    a metal substrate;
    an anti-coking catalyst layer, wherein said anti-coking catalyst comprises perovskite, said perovskite selected from the group consisting of doped $LaCrO_3$, doped $LaMnO_3$, $BaCeO_3$, $BaZrO_3$, $BaCe_xZr_{(1-x)}O_3$, $BaCe_xY_{(1-x)}O_3$ and combinations thereof, wherein $0 \leq x \leq 1$; and
    an alumina barrier layer disposed between the metal substrate and the anti-coking catalyst layer,
       wherein said perovskite is $BaCe_xZr_{(1-x)}O_3$, wherein $0 \leq x \leq 1$.

11. The article as in claim 10, wherein the perovskite is $BaCe_{0.7}Zr_{0.3}O_3$.

12. An article, comprising:
    a metal substrate;
    an anti-coking catalyst layer; and
    an alumina barrier layer disposed between the metal substrate and the anti-coking catalyst layer,
       wherein the metal substrate contains less than 3 wt % aluminum.

* * * * *

UNITED STATES PATENT AND TRADEMARK OFFICE
CERTIFICATE OF CORRECTION

PATENT NO. : 9,901,892 B2  
APPLICATION NO. : 14/651240  
DATED : February 27, 2018  
INVENTOR(S) : Guo et al.

Page 1 of 1

It is certified that error appears in the above-identified patent and that said Letters Patent is hereby corrected as shown below:

On the Title Page

(87) PCT Pub. Date: Jun. 9, 2014 - should be corrected to read as:  
(87) PCT Pub. Date: Jun. 19, 2014

Signed and Sealed this  
Eleventh Day of December, 2018

Andrei Iancu  
*Director of the United States Patent and Trademark Office*